(12) United States Patent
Douma

(10) Patent No.: US 7,181,100 B2
(45) Date of Patent: Feb. 20, 2007

(54) INTERCONNECT MECHANISM FOR CONNECTING A LASER DRIVER TO A LASER

(75) Inventor: Darin James Douma, Monrovia, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/370,311

(22) Filed: Mar. 8, 2006

(65) Prior Publication Data

US 2006/0204168 A1 Sep. 14, 2006

Related U.S. Application Data

(60) Provisional application No. 60/659,981, filed on Mar. 9, 2005.

(51) Int. Cl.
*G02B 6/12* (2006.01)
(52) U.S. Cl. .................. 385/14; 398/135; 398/137
(58) Field of Classification Search ............ 385/14, 385/129, 135, 137
See application file for complete search history.

(56) References Cited

U.S. PATENT DOCUMENTS 6,912,361 B2 * 6/2005 Aronson et al. ............ 398/135
6,965,722 B1 * 11/2005 Nguyen ...................... 385/147

\* cited by examiner

*Primary Examiner*—Jennifer Doan
(74) *Attorney, Agent, or Firm*—Workman Nydegger

(57) ABSTRACT

A transmission mechanism for transmitting an electrical signal from the output stage of an electro-optic transducer driver to an electro-optic transducer. The transmission mechanism includes the electro-optic transducer, the electro-optic transducer driver and a termination resistor. A first node of the termination resistor is coupled to the first differential input terminal of the electro-optic transducer. A second node of the termination resistor is coupled to the first output node of the electro-optic transducer driver. In addition, a second differential input terminal of the electro-optic transducer is coupled to a second output node of the electro-optic transducer driver. Such connections provide for a first DC path from the first differential input terminal of the electro-optic transducer to the second electro-optic transducer driver output node and a second DC path from the first node of the termination resistor to first electro-optic transducer driver output node.

22 Claims, 3 Drawing Sheets

INTERCONNECT MECHANISM FOR CONNECTING A LASER DRIVER TO A LASER

CROSS-REFERENCE TO RELATED APPLICATIONS

This application claims the benefit of U.S. Provisional Application No. 60/659,981, filed Mar. 9, 2005, which is incorporated herein by reference in its entirety.

BACKGROUND

1. The Field of the Invention

The present invention relates generally to optical transmitters. More specifically, the present invention relates to an interconnect mechanism for connecting a laser driver to a laser with high signal fidelity and low voltage and power loss.

2. Background and Relevant Art

Computing and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from as modest as a small Local Area Network (LAN) to as grandiose as the backbone of the Internet.

Typically, data transmission in such networks is implemented by way of an optical transmitter (also referred to as an electro-optic transducer), such as a laser or Light Emitting Diode (LED). The electro-optic transducer emits light when current is passed through it, the intensity of the emitted light being a function of the current magnitude. An electro-optic transducer driver generates the appropriate magnitude of current to pass through the electro-optic transducer to generate the appropriate amount of optical intensities corresponding to the data being transmitted.

In order to assert one binary value, a relatively low current (called herein "$I_{BIAS}$") is passed through the electro-optic transducer to thereby cause a relatively low optical power level to be transmitted onto the optical fiber. In order to assert the opposite binary value, a relatively high current is passed through the electro-optic transducer to thereby cause a relatively high optical power level (e.g., $I_{BIAS}$ plus a maximum modulation current called herein "$I_{MOD}$") to be transmitted onto the optical fiber. Accordingly, by superimposing a modulation current (that varies between zero and $I_{MOD}$) upon the bias current, an appropriate sequence of bits may be transmitted.

FIG. 1 illustrates a driver-transducer circuit 100 that includes an electro-optic transducer 101 in the form of a specially manufactured diode. Methods for fabricating electro-optic transducer 101 in the form of a diode are well known in the art. The optical power transmitted by the electro-optic transducer 101 is approximately proportional to the amount of current passed through the electro-optic transducer 101 for the frequency range of interest.

FIG. 1 also illustrates an electro-optic transducer driver output stage 110. The electro-optic transducer driver output stage 110 applies the appropriate current through the electro-optic transducer 101 depending on the data. In the illustrated embodiment, the electro-optic transducer 110 is what is referred to as "DC-coupled" to the electro-optic transducer 101. Note that although it is not illustrated in FIG. 1, transmission structures such as transmission lines may be utilized between electro-optic transducer driver output stage 110 and transducer 101.

Specifically, a bias current source 111 draws a bias current $I_{BIAS}$ through the electro-optic transducer 101. In addition, a modulation current source 112 draws the maximum modulation current $I_{MOD}$ through either the bipolar transistor 121, or the bipolar transistor 122, or through both of the bipolar transistors 121 and 122 in a split manner. The amount of modulation current $I_{MOD}$ drawn through the electro-optical transducer 101 depends on the differential data signals DATA and DATA! applied at the base terminal of the corresponding bipolar transistors 121 and 122.

The DC-coupled circuitry 100 of FIG. 1 is advantageous in that the modulation current is drawn completely through the electro-optic transducer 101 through the bi-polar transistor 122. In addition, bias current $I_{BIAS}$ is used to bias both electro-optical transducer 101 and driver output stage 110. Accordingly, the circuit 100 is highly efficient.

However, DC-coupling is generally a single-ended strategy to drive electro-optical transducer 101. In other words, electro-optical transducer 101 must be connected to either the output of transistor 121 or transistor 122, but not both. For example, electro-optic transducer 101 is connected to transistor 122 while transistor 121 is terminated by a termination resistor 105 that is used to balance the complimentary transistor pair. Accordingly, DC-coupled circuitry 100 does not take full advantage of the symmetry created by complimentary nature of transistors 121 and 122. For instance some the speed and signal fidelity advantages created by the complimentary pair 121 and 122 may be lost in the single-ended configuration.

Furthermore, as the DC-coupled circuit 200 is single-ended, it requires a very low inductance ground in the current return path. This is because all the current is returned to ground via only one of the transistors, instead of both transistors as in a differential circuit. For example, the current return path to the ground is at bias source 111. Low impedance grounds, however, are difficult to manufacture in optical transmit circuits.

FIG. 2 illustrates another conventional driver-transducer circuit 200. In this circuit, the modulation current of the electro-optic transducer driver output stage 210 is "AC-coupled" to the electro-optic transducer 201. A bias current source 211 supplies the bias current $I_{BIAS}$ plus $I_{MOD}/2$ through the electro-optic transducer 201. A modulation current source 212 causes modulation current to pass through the electro-optic transducer 201 through AC-coupling capacitors 225A and 225B.

Specifically, the modulation current source draws 1/n times (where "n" is the AC coupling coefficient) the maximal modulation current $I_{MOD}$ in a split manner through the bipolar transistors 221 and 222. The amount of current drawn through pull-up resistor 223 and through bipolar transistor 221 depends on data signal DATA and DATA!. Accordingly, the amount of current drawn through source pull-up resistor 224 and bipolar transistor 222 depends on data signal DATA and DATA! as well, since the sum of current drawn through both bipolar transistors 221 and 222 remains constant at $I_{MOD}/n$.

The amount of current drawn through bipolar transistor 222 may thus vary from zero to $I_{MOD}/n$, depending on the data signal DATA. Conversely, the current drawn through bipolar transistor 221 may vary from zero to $I_{MOD}/n$ as well, in a complementary manner to the current drawn through bipolar transistor 222. The resulting differential current is AC-coupled through transmission mechanism 205. For example, differential current is AC-coupled through the capacitors 225A and 225B, through corresponding transmission lines 226A and 227B, and through corresponding load resistors 227A and 227B (each having resistance $R_L$) so that only the fraction equal to the AC-coupling coefficient "n" of the differential current passing through bipolar transistors 222 and 221 is provided through the electro-optic transducer 201. Therefore, the modulation current provided through the electro-optic transducer 301 varies from zero to $I_{MOD}$, depending on the data signal DATA.

The AC-coupled driver-transducer circuit 200 of FIG. 2 is advantageous in that the circuit takes full advantage of the complimentary nature of transistors 221 and 222 in terms of speed and signal fidelity. However, the AC-coupled driver-transducer circuit 200 does have a significant disadvantage. The driver circuit output stage 210 in the AC-coupled driver-transducer circuit 200 must draw more modulation current than the driver circuit output stage 110 in the DC-coupled driver-transducer circuit 1100 of FIG. 1. For instance, the modulation current drawn by driver circuit 210 is $I_{MOD}/n$, where "n" (the coupling coefficient) is less than one, and is ideally around 50% for optimal performance. In addition, the coupling capacitors 225A and 225B make it so driver output stage 210 and transducer 201 must use separate biasing currents, thus using power less efficiently.

As an additional disadvantage, the presence of the load resistors 223 and 224 means that the driver circuit 210 must generally operate using higher supply voltages as the load resistors may cause a large voltage drop. The driver circuit 210 of the DC-coupled configuration may operate at 3.3 volts, whereas the driver circuit 310 of the AC-coupled configuration may use supply voltages of 5 volts.

BRIEF SUMMARY

Embodiments disclosed herein relate to a transmission mechanism for transmitting an electrical signal from the output stage of an electro-optic transducer driver to an electro-optic transducer. The transmission mechanism includes the electro-optic transducer, the electro-optic transducer driver and a termination resistor.

The electro-optic transducer, which may be a laser or LED, includes first and second differential input terminals. The first differential input terminal is configured to be coupled to a voltage source when operational. The electro-optic transducer driver includes a first output node and a second output node. The termination resistor also has first and second nodes.

The first node of the termination resistor is coupled to the first differential input terminal of the electro-optic transducer. The second node of the termination resistor is coupled to the first output node of the electro-optic transducer driver. In addition, the second differential input terminal of the electro-optic transducer is coupled to the second output node of the electro-optic transducer driver. Such connections provide for a first DC path from the first differential input terminal of the electro-optic transducer to the second electro-optic transducer driver output node and a second DC path from the first node of the termination resistor to first electro-optic transducer driver output node.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows, and in part will be obvious from the description, or may be learned by the practice of the embodiments disclosed herein. The features and advantages of the embodiments disclosed herein may be realized and obtained by means of the instruments and combinations particularly pointed out in the appended claims. These and other features of the embodiments disclosed herein will become more fully apparent from the following description and appended claims, or may be learned by the practice of the embodiments disclosed herein as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

The embodiments disclosed herein relate to an optical transmit circuit that includes a driver output stage, an electro-optic transducer, and a transmission mechanism/interconnect stage for transmitting an electrical signal from the driver stage to the electro-optic transducer. The transmission mechanism/interconnect stage is able to provide good termination for transmission line structures using a single termination resistor. Accordingly, a smaller voltage supply may be utilized to drive the circuit and available voltage headroom is saved. In addition, some embodiments have increased signal and power performance over conventional optical transmit circuits and may also be low cost to produce.

Figure 1:
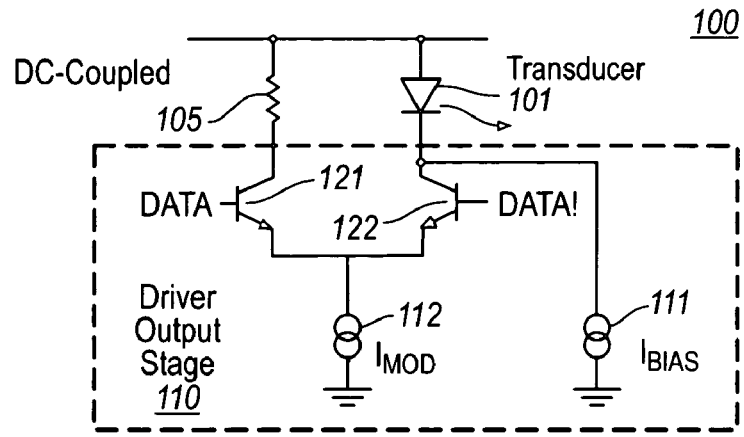
FIG. 1 illustrates a circuit diagram of a conventional driver-transducer circuit in which the electro-optic transducer driver is DC-coupled to the electro-optic transducer.
Figure 2:
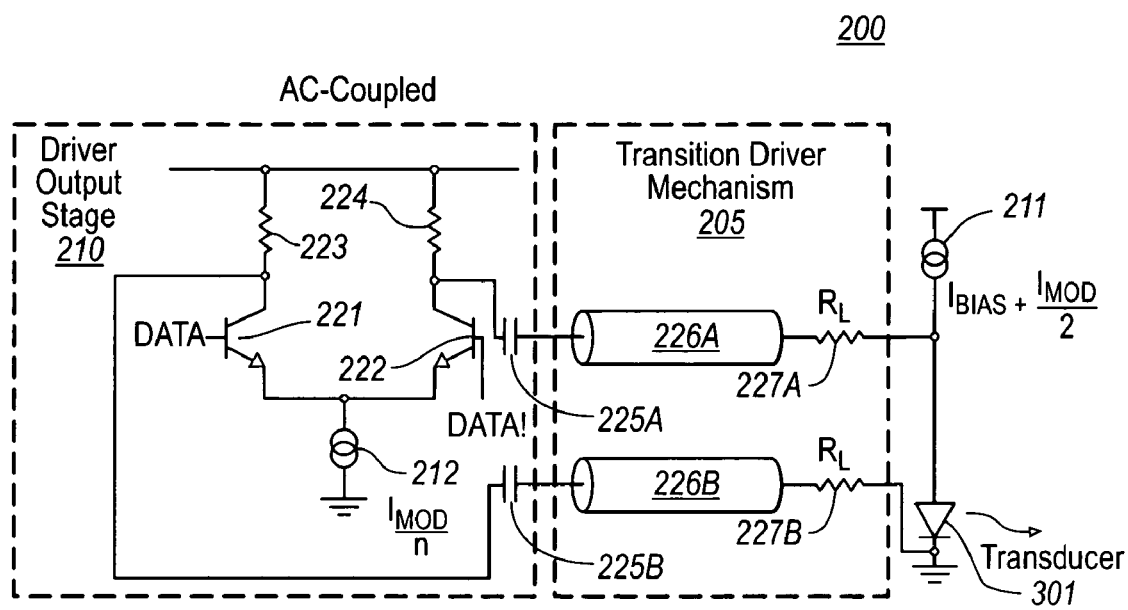
FIG. 2 illustrates a circuit diagram of a conventional driver-transducer circuit in which the electro-optic transducer driver is AC-coupled to the electro-optic transducer.
Figure 3:
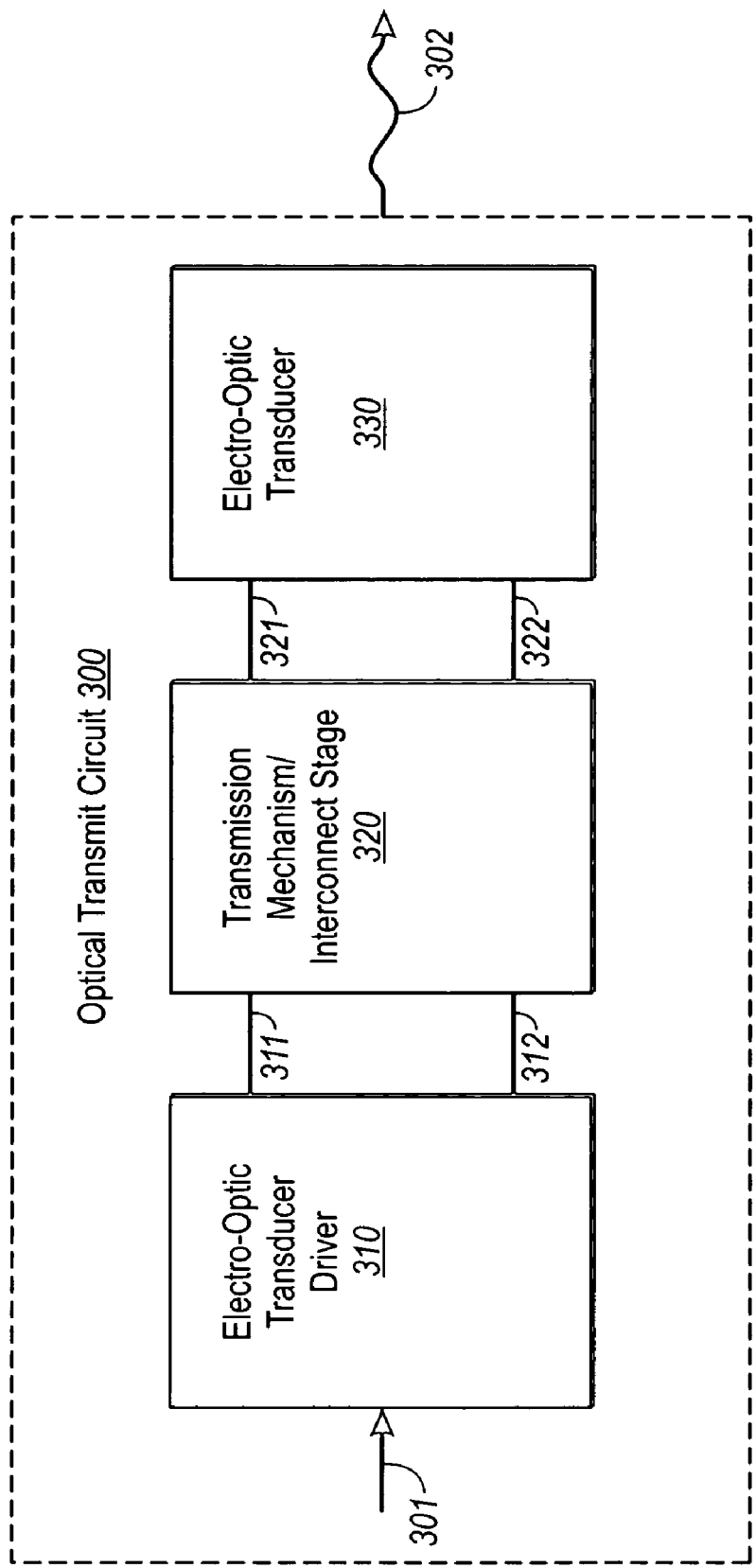
FIG. 3 illustrates a circuit diagram of an optical transmit circuit that includes an transmission mechanism in accordance with embodiments disclosed herein

FIG. 3 illustrates an optical transmit circuit 300 in which the embodiments disclosed herein may be employed. While the optical transmit circuit 300 will be described in some detail, the optical transmit circuit 300 is described by way of illustration only, and not by way of restricting the scope of the appended claims. The embodiments disclosed herein are suitable for 1 G, 2 G, 4 G, 10 G and higher bandwidth fiber optic links. Furthermore, the embodiments disclosed herein may be implemented in optical (e.g., laser) transmitter/receivers of any form factor such as XFP, SFP and SFF, without restriction. Having said this, the embodiments disclosed herein are not limited to an optical transceiver environment at all.

The optical transmit circuit 300 may receive an electrical signal from a source such as a host computing system connected to electro-optic transducer driver 310 as represented by arrow 301. Electro-optic transducer driver 310, which may be, but is not limited to, a laser driver or a Light Emitting Diode (LED) driver, is used to drive electro-optic transducer 330 by controlling operational parameters such as bias current. A transmission mechanism or interconnect stage 320 is interposed between the electro-optic transducer driver 310 and the electro-optic transducer 330 so as to optimize transmission of electrical signals from the electro-optic transducer driver 310 to the electro-optic transducer 330.

Electro-optic transducer driver 310 has two output terminals or nodes, both of which are coupled to transmission mechanism 320, as shown by connections 311 and 312. Although two connections are illustrated between the electro-optic transducer driver 310 and the transmission mechanism 320 for differential signaling, the electro-optic transducer driver 310 may also have more than two signal connections with the transmission mechanism 320.

Note that in the description and in the claims, "coupled to" is defined to mean both a direct connection between two or more circuit objects without any intervening circuit objects and an indirect connection between two or more circuit objects with one or more intervening circuit objects. For example, two circuit objects directly connected to each other are "coupled to" one another. The same two circuit objects would also be "coupled to" each other if there were one or more intervening circuit objects connected between them.

The transmission mechanism/interconnect stage 320 receives an electric signal from electro-optic transducer driver 310 over connections 311 and 312. Although shown with two input nodes, the transmission mechanism/interconnect stage 320 may have any number of additional input nodes as necessary. In many embodiments, the transmission mechanism/interconnect stage 320 will have the same number of input nodes as electro-optic transducer driver 310 has output terminals, although this is not required. As mentioned, the transmission mechanism/interconnect stage 320 optimizes transmissions between the electro-optic transducer driver and the electro-optic transducer. Specific embodiments of transmission mechanism/interconnect stage 320 will be described below. Note that in some embodiments, transmission mechanism/interconnect stage 320 may be a part of electro-optic transducer driver 310, may be external to electro-optic transducer driver 310, or may have portions that are part of electro-optic transducer driver 310 and portions that are external to electro-optic transducer driver 310.

Electro-optical transducer 330 input terminals are connected to the output nodes of transmission mechanism/interconnect stage 320 as shown by connections 321 and 322. Electro-optical transducer 330 may have two input terminals as shown in FIG. 3 or it may have additional input terminals as needed. Electro-optical transducer 330, which may be a laser or an LED, receives an electric signal from transmission mechanism 320 and transforms the electric signal into an optical signal that is representative of the information contained in the electric signal. Electro-optical transducer 330 may then emit the optical signal onto an output connection 302. Optical connection 302 may be, for example, an optical fiber coupled to a remote optical transceiver. In this way, optical transmit circuit 300 works to take an electric signal, transform it into an optical signal, and communicate with an outside source.

The optical transmit circuit 300 may be part of an optical transceiver module and/or it may be part of a host computing system. Alternatively, portions of transmit circuit 300 may be within the optical transceiver, while other portions are in the host computing system. For example, the transmit circuit 300 may be entirely enclosed by an optical transceiver module. The optical transceiver may be coupled to a host computing system. Alternatively, a component of transmit circuit 300, for example the electro-optic transducer driver 310, may be housed in the host computing system while the remaining components are housed within an optical transceiver module. The placement of transmit circuit 300 components, whether in a host computing system or an optical transceiver module is not important to the embodiments disclosed herein.

Figure 4:
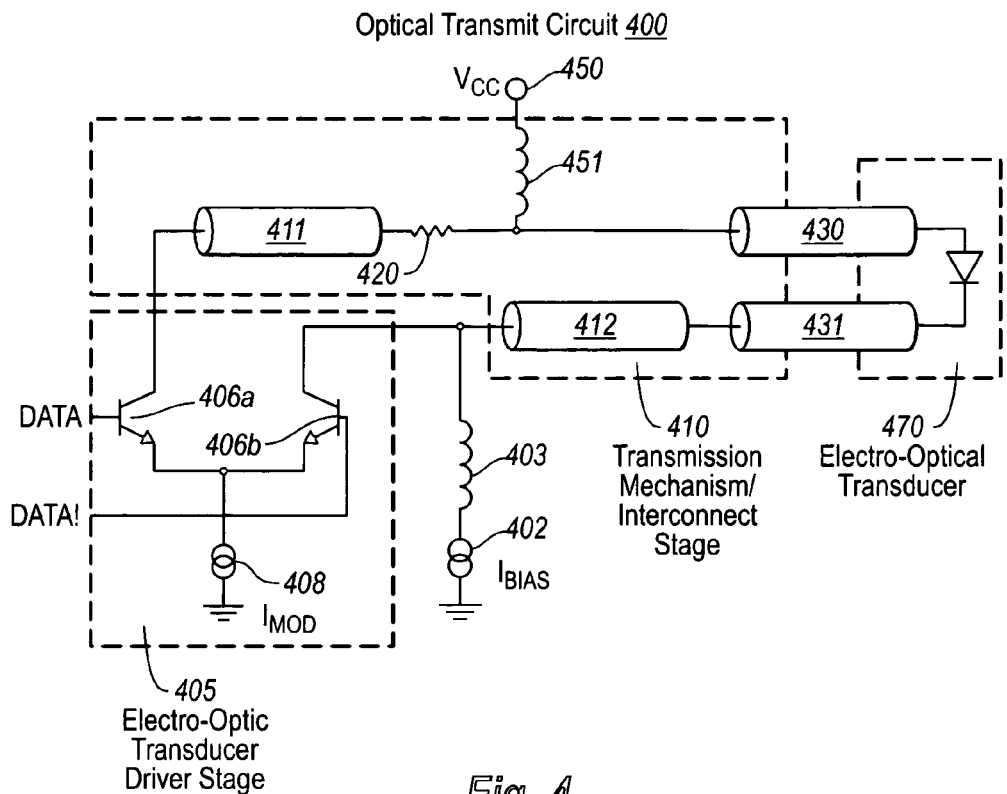
FIG. 4 illustrates a circuit diagram of a DC-coupled transmission mechanism in accordance with embodiments disclosed herein.

Turning now to FIG. 4, an illustration of an example DC-coupled optical transmit circuit 400 corresponding to one particular embodiment of the transmit circuit 300 is shown. Note that this embodiment is for illustration only and should not be used to limit the scope of the appended claims.

As illustrated, optical transmit circuit 400 includes an electro-optic transducer driver output stage 405 (also herein after referred to as "driver stage 405"). In the illustrated embodiment, electro-optic transducer driver 405 is illustrated as a Current Mode Logic (CML) output stage. The CML output stage is typically a differential output stage with two complimentary output nodes, thus allowing the output stage to take advantage of the speed and signal fidelity advantages of a differential output. Note that the embodiments disclosed herein also contemplate using other types of electro-optic transducer driver stages. In some embodiments, electro-optic transducer driver 405 may be a laser driver.

Optical transmit circuit 400 includes a voltage source 450 for providing current to the circuit. To generate the AC component of the current, the electro-optic transducer driver output stage 405 has a differential data input terminal for receiving differential data (illustrated as signals DATA and DATA!) to be transmitted as an optical signal. Data input differential bipolar transistor pair 406A and 406B have their base terminals coupled to the differential data input terminals. For example, if the optical transmit circuit 400 is part of an optical transceiver coupled to a host computing system, the data may be provided by the host computing system. In the illustrated embodiment, transistor 406A has its base terminal coupled to data signal DATA, while transistor 406B has its base terminal coupled to complementary data signal DATA!. In addition, bipolar transistor pair 406A and 406B have their respective emitter terminals coupled to a modulation current source 408 that provides a modulation current $I_{MOD}$. Accordingly, the modulation current is drawn from the emitter terminals of the data input bipolar transistors 406A and 406B using current source 408.

In addition, the collector of transistor 406B is coupled to a bias current source 402. In some embodiments, an inductor 403, which may be any reasonable inductor, is coupled between the collector node and the bias current source 402. Accordingly, the bias current $I_{BIAS}$ is pulled through the electro-optic transducer 470 by transistor 406B as will be described in more detail to follow. Advantageously, as optical transmit circuit 400 is DC-coupled, the same bias current may be used to bias the driver stage 405 and the electro-optic transducer 470.

The data input bipolar transistors 406A and 406B further have their collector terminals coupled to the input of transmission mechanism/interconnect stage 410. The collector terminals act as output nodes for the electro-optic transducer driver stage 405. In the illustrated embodiment, the collector of transistor 406A is coupled to a transmission line structure 411 while the collector of transistor 406B is coupled to a transmission line structure 412. In some embodiments, the transmission line structures 411 and 412 may be Printed Circuit Board (PCB traces), although this is not required.

Note that the transmission line structures 411 and 412 are used to couple the output nodes of the driver stage 405 to the input differential terminals of electro-optic transducer 470. Transmission line structures 411 and 412 may therefore be different lengths as circumstance warrant. In some embodiments, however, the output nodes of driver stage 405 may coupled to the electro-optic transducer 470 without the use of transmission line structures 411 and 412 or any of the other transmission line structures that will be discussed in more detail to follow.

In any case, it should be noted that both output nodes of driver stage 405 are coupled, either directly or indirectly, to the differential input terminals of the electro-optic transducer 470. Accordingly, this allows optical transmit circuit 400 to take advantage of the speed and signal fidelity advantages of a differential output. This is in contrast to the DC-coupled transmit circuit discussed previously where only one of the output nodes was coupled to the transducer, the other node being terminated by a resistor.

As is typically the case, transmission line structures 411 and 412 need to be terminated to prevent unwanted reflections from degrading the transmitted optical signal. In conventional transmit circuits, a termination would be required for both transmission line structures. Advantageously, the principles of the present invention allow for a single termination that will effectively terminate all the transmission line structures in optical transmit circuit 400. In other words, there is no need for separate termination for both transmission line structures 411 and 412. For example, a termination resistor 420 may be coupled between transmission structure 411 and a first differential input terminal of the electro-optic transducer 470. As illustrated, a node of the termination resistor 420 is also coupled to the voltage source 450. In some embodiments, the termination resistor 420 is coupled to the voltage source 450 through an inductor 451, which may be any reasonable inductor.

Typically, termination resistor 420 has a resistance value specified to match the impedance of transmission lines 411 and 412, as well as any other transmission line structures that may be part of optical transmit circuit 400. In some embodiments, termination resistor 420 may be on the order of 20–50 ohms, although other values may also be used as circumstances warrant. Advantageously, using a single termination resistor 420 to terminate the various transmission line structures allows for a lower voltage VCC for the system from voltage source 450 and a higher available drive current for electro-optic transducer 470 as will be explained in greater detail to follow. In addition, production costs may be lowered as fewer resistors need be placed in the vicinity of the electro-optic transducer, which may be a difficult and costly procedure.

Returning to FIG. 4, in some embodiments electro-optic transducer 470 is contained within a TO Can or similar structure. In such cases, it is often necessary to implement additional transmission line structures to pass the optical signal through the header of the TO Can. For example, the right hand side node of termination resistor 420 may be coupled to a transmission line structure 430 while transmission line structure 412 is further coupled to a transmission line structure 431. In some embodiments, transmission line structures 430 and 431 may be TO Can header base feedthroughs, although this is not required. In additional embodiments, transmission lines structures 412 and 431 may be the same transmission line structure.

As mentioned previously, electro-optic transducer 470, which may be a laser or an LED, has first and second differential input terminals. The first differential input (the anode in FIG. 4) is configured to be coupled to voltage source 450 when transmit circuit 400 is operational. As illustrated, the first node is also coupled to the right hand node of termination resistor 420 through transmission line structure 430. The second differential input node (the cathode in FIG. 4), one the other hand, may be coupled to the collector of transistor 406B, either directly or indirectly through transmission line structures 412 and/or 431.

The circuit topography just described for transmit circuit 400 produces two DC paths that advantageously allow transmit circuit 400 to have efficient power performance. For example, current is pulled by transistor 406B through a first DC path that runs from voltage source 450 and inductor 451, through the first and second differential inputs of electro-optic transducer 470, to ground through inductor 403 and current source 402. Note that the current would also pass through any transmission line structures such as transmission line structures 412 and/or 431 that may be coupled between the other circuit components in the path. As mentioned previously, there is no termination resistor in this path that may cause a large voltage drop in addition to the inherent voltage drop of electro-optic transducer 470 and other components in this path. Advantageously, a smaller voltage source 450 may be used to provide the required current to drive the electro-optic transducer 470. In addition, a smaller amount of the available voltage headroom is consumed to drive electro-optic transducer 470. This allows the circuit to function over a wider range of currents and temperatures as there is not as large a strain on the voltage headroom.

In the second DC path, current is pulled by transistor 406A from voltage source 450 and inductor 451, through termination resistor 420 to transistor 406A. Note that the current would also pass through any transmission line structures such as transmission line structures 411 and/or 430 that may be coupled between the other circuit components in the path. In this DC path, there will be a voltage drop across the termination resistor 420. However, since the voltage drop is not in the electro-optic transducer 470's current path, the voltage headroom savings and power efficiencies already mentioned may be realized.

Figure 5:
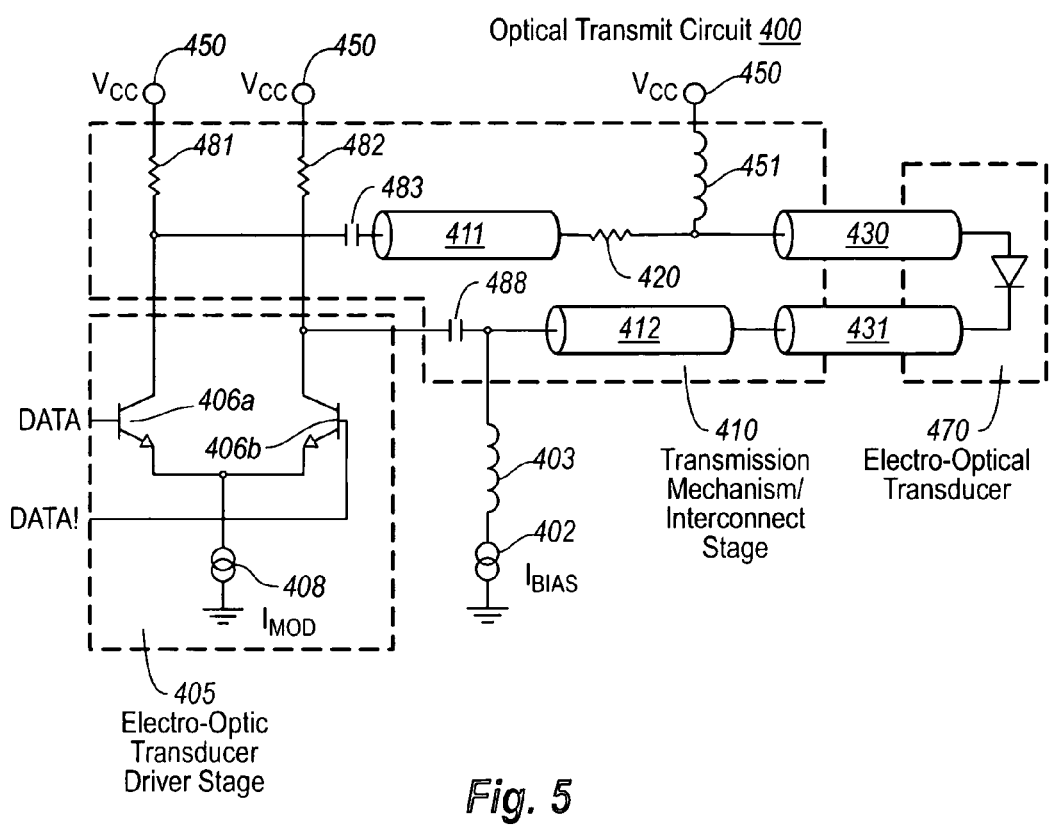
FIG. 5 illustrates a circuit diagram of an AC-coupled transmission mechanism in accordance with embodiments disclosed herein.

Referring now to FIG. 5, an AC-coupled embodiment of optical circuit 400 is depicted. Note that the circuit topography is similar to the embodiment discussed in relation to FIG. 4 and that many of the components are the same and thus will not be described here. Since this embodiment is AC-coupled, optical transmit circuit 400 further includes a pull resistor 481 coupled between voltage source 450 and the collector of transistor 406A and a pull resistor 482 coupled between voltage source 450 and the collector of transistor 406B. Optical transmit circuit 400 further includes an AC-coupling capacitor 483 coupled between the collector of transistor 406A and transmission line structure 411 and an AC-coupling capacitor 488 coupled between the collector of transistor 406B and transmission line structure 412. As mentioned earlier, AC-coupling requires the use of separate biasing for the driver stage 405 and the electro-optic transducer 470. Accordingly, some of the power efficiencies discussed in relation to FIG. 4 are lost. In addition, the AC-coupling capacitors 483 and 488 may introduce some signal distortion due to parasitic inductance.

However, the AC-coupling embodiment, while not having as nice a performance as the embodiment discussed in relation to FIG. 4, still has advantages over conventional AC-coupled transmit circuits. For example, the topography of FIG. 5 still allows for a single termination resistor 420 to terminate the various transmission line structures in the transmit circuit 400. In addition, the topography also still allows for the two separate DC paths. As with the embodiment discussed in relation to FIG. 4, the DC path through electro-optic transducer 470 does not include termination resistor 420. Accordingly, the embodiment of FIG. 5 is still able to take advantage of the lower voltage source and the voltage headroom savings previously discussed.

Accordingly, the embodiments disclosed herein relate to an optical transmit circuit that includes a driver output stage, an electro-optic transducer, and a transmission mechanism/interconnect stage for transmitting an electrical signal from the driver stage to the electro-optic transducer. The transmission mechanism/interconnect stage is able to provide good termination for transmission line structures using a single termination resistor in both AC-coupled and DC-coupled embodiments. Accordingly, a smaller voltage supply may be utilized to drive the circuit and available voltage headroom is saved. In addition, DC-coupled embodiments use a, differential transmission scheme, thus allowing the optical transmit circuit to take advantage of the speed and signal fidelity advantages of a differential output. Accordingly, the embodiments disclosed herein represent a significant advancement over conventional AC-coupled and DC-coupled optical transmit circuits.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

I claim:

1. A transmission mechanism for transmitting an electrical signal from the output stage of an electro-optic transducer driver to an electro-optic transducer comprising:
    first and second differential input terminals of an electro-optic transducer, wherein the first differential input terminal is configured to be coupled to a voltage source when operational;
    a termination resistor having a first node coupled to the first differential input terminal of the electro-optic transducer;
    a first electro-optic transducer driver output node coupled to a second node of the termination resistor;
    a second electro-optic transducer driver output node coupled to the second differential input terminal of the electro-optic transducer;
    a first DC path from the first differential input terminal of the electro-optic transducer to the second electro-optic transducer driver output node; and
    a second DC path from the first node of the termination resistor to first electro-optic transducer driver output node.

2. The transmission mechanism in accordance with claim 1 further comprising:
    a transmission line coupled between the second node of the termination resistor and the first output node of the electro-optic transducer driver; and
    a transmission line coupled between the second differential input node of the electro-optic transducer and the second output node of the electro-optic transducer driver.

3. The transmission mechanism in accordance with claim 2, wherein the transmission lines are one of printed circuit board (PCB) traces and header base feed-throughs.

4. The transmission mechanism in accordance with claim 1 further comprising:
    a transmission line coupled between the first node of the termination resistor and the first differential input node of the electro-optic transducer; and
    a transmission line coupled to the second differential input node of the electro-optic transducer and the second output node of the electro-optic transducer driver.

5. The transmission mechanism in accordance with claim 4, wherein the transmission lines are one of PCB traces and header base feed-throughs.

6. The transmission mechanism in accordance with claim 1, wherein the first and second electro-optic transducer driver output nodes are configured to provide DC biasing and AC modulation to the electro-optic transducer during operation.

7. The transmission mechanism in accordance with claim 1, wherein the first and second electro-optic transducer driver output nodes are DC-coupled to the first and second differential input terminals of the electro-optic transducer.

8. The transmission mechanism in accordance with claim 1, wherein the first and second electro-optic transducer driver output nodes are AC-coupled to the first and second differential input terminals of the electro-optic transducer.

9. The transmission mechanism in accordance with claim 1, wherein the electro-optic transducer is one of a laser diode or a Light Emitting Diode (LED).

10. The transmission mechanism in accordance with claim 1, wherein the first and second output nodes of the electro-optic transducer driver are part of a Current Mode Logic (CML) electro-optic transducer driver output stage.

11. An optical transmit circuit comprising:
    an electro-optic transducer;
    an electro-optic transducer driver; and
    an interconnect stage coupled between the electro-optic transducer driver and the electro-optic transducer;
    wherein the interconnect stage comprises the following:
        first and second differential input terminals of the electro-optic transducer, wherein the first differential input terminal is configured to be coupled to a voltage source when operational;
        a termination resistor having a first node coupled to the first differential input terminal of the electro-optic transducer;
        a first electro-optic transducer driver output node coupled to a second node of the termination resistor;
        a second electro-optic transducer driver output node coupled to the second differential input terminal of the electro-optic transducer;
        a first DC path from the first differential input terminals of the electro-optic transducer to the second electro-optic transducer driver output node; and
        a second DC path from first node of the termination resistor to first electro-optic transducer driver output node.

12. The optical transmit circuit in accordance with claim 11, wherein the interconnect stage further comprises:
    a transmission line coupled between the second node of the termination resistor and the first output node of the electro-optic transducer driver; and a transmission line coupled between the second differential input node of the electro-optic transducer and the second output node of the electro-optic transducer driver.

13. The optical transmit circuit in accordance with claim 12, wherein the transmission lines are one of printed circuit board (PCB) traces and header base feed-throughs.

14. The optical transmit circuit in accordance with claim 11, wherein the interconnect stage further comprises:
a transmission line coupled between the first node of the termination resistor and the first differential input node of the electro-optic transducer; and
a transmission line coupled to the second differential input node of the electro-optic transducer and the second output node of the electro-optic transducer driver.

15. The optical transmit circuit in accordance with claim 14, wherein the transmission lines are one of PCB traces and header base feed-throughs.

16. The optical transmit circuit in accordance with claim 11, wherein the first and second electro-optic transducer driver output nodes are configured to provide DC biasing and AC modulation to the electro-optic transducer during operation.

17. The optical transmit circuit in accordance with claim 11, wherein the first and second electro-optic transducer driver output nodes are DC-coupled to the first and second differential input terminals of the electro-optic transducer.

18. The optical transmit circuit in accordance with claim 11, wherein the first and second electro-optic transducer driver output nodes are AC-coupled to the first and second differential input terminals of the electro-optic transducer.

19. The optical transmit circuit in accordance with claim 11, wherein the electro-optic transducer is one of a laser diode or a Light Emitting Diode (LED).

20. The optical transmit circuit in accordance with claim 11, wherein the electro-optic transducer driver is one of a laser driver or a LED driver.

21. The optical transmit circuit in accordance with claim 11, wherein the optical transmit circuit is one of a 1G laser transceiver, a 2G laser transceiver, a 4G laser transceiver, a 8G laser transceiver, a 1G laser transceiver, or a laser transceiver suitable for fiber optic links greater than 10 G.

22. The optical transmit circuit in accordance with claim 11, wherein the optical transmit circuit is one of a XFP laser transceiver, a SFP laser transceiver, or a SFF laser transceiver.

* * * * *

UNITED STATES PATENT AND TRADEMARK OFFICE
CERTIFICATE OF CORRECTION

PATENT NO.         : 7,181,100 B2
APPLICATION NO. : 11/370311
DATED                : February 20, 2007
INVENTOR(S)       : Darin James Douma It is certified that error appears in the above-identified patent and that said Letters Patent is hereby corrected as shown below:

Column 2
Line 34, change "200" to --100--

Column 3
Line 4, change "226A and 227B" to --226A and 226B--
Line 20, change "1100" to --100--

Column 4
Line 32, change "an transmission" to --a transmission--

Column 6
Line 24, change "driver 405" to --driver stage 405--
Line 32, change "driver 405" to --driver stage 405--

Column 7
Line 6, change "Circuit Board" to --Circuit Boards--
Line 44, change "lines 411" to --line structures 411--

Column 8
Line 45, change "transducer 470's" to --transducer's 470--

Column 12
Line 18, change "1G laser transceiver" to --10G laser transceiver--
Line 21, change "a XFP" to --an XFP--
Line 22, change "a SFP" to --an SFP--

UNITED STATES PATENT AND TRADEMARK OFFICE
CERTIFICATE OF CORRECTION

PATENT NO. : 7,181,100 B2
APPLICATION NO. : 11/370311
DATED : February 20, 2007
INVENTOR(S) : Darin James Douma It is certified that error appears in the above-identified patent and that said Letters Patent is hereby corrected as shown below:

Column 12 (Cont.)
Line 22, change "a SFF" to --an SFF--

Signed and Sealed this

Thirtieth Day of September, 2008

JON W. DUDAS
*Director of the United States Patent and Trademark Office*